United States Patent
Bohley et al.

(10) Patent No.: US 6,798,183 B2
(45) Date of Patent: Sep. 28, 2004

(54) METHOD OF AND APPARATUS FOR SIMULTANEOUSLY PROVIDING TONE AND INTERMITTENT LINK ONTO A CABLE TO ASSIST IDENTIFYING THE CABLE

(75) Inventors: Thomas K. Bohley, Colorado Springs, CO (US); Thomas Doumas, Colorado Springs, CO (US); Mark Keisling, Monument, CO (US)

(73) Assignee: Fluke Corporation, Everett, WA (US)

( * ) Notice: Subject to any disclaimer, the term of this patent is extended or adjusted under 35 U.S.C. 154(b) by 29 days.

(21) Appl. No.: 10/164,918

(22) Filed: Jun. 4, 2002

(65) Prior Publication Data

US 2003/0222653 A1 Dec. 4, 2003

(51) Int. Cl.7 .......................... G01R 19/00; H04M 1/24
(52) U.S. Cl. ........................................ 324/66; 379/25
(58) Field of Search .......................... 324/66, 67, 542, 324/539, 543, 637, 639, 645, 76.51, 76.55, 76.57, 538, 556; 379/361, 25

(56) References Cited

U.S. PATENT DOCUMENTS

| | | | | |
|---|---|---|---|---|
| 5,847,557 A | * | 12/1998 | Fincher et al. | 324/66 |
| 6,434,716 B1 | * | 8/2002 | Johnson et al. | 714/712 |
| 6,707,305 B2 | * | 3/2004 | Johnson et al. | 324/542 |
| 2003/0071634 A1 | * | 4/2003 | Johnson et al. | 324/542 |

OTHER PUBLICATIONS

Progressive Electronics, LAN Toner Test Set product description, publication date possibly Sep. 2001, 2 pages.
Progressive Electronics, AT8L LAN Toner Test Set instruction maual, publication date possibly Sep. 2001, 12 pages.

* cited by examiner

Primary Examiner—N. Le
Assistant Examiner—Donald M Lair
(74) Attorney, Agent, or Firm—Dellett & Walters

(57) ABSTRACT

A test device for assisting in locating a cable efficiently provides both tone and link pulses simultaneously to a cable under test. The link pulses are alternated between transmit and receive pairs on the cable.

20 Claims, 3 Drawing Sheets

METHOD OF AND APPARATUS FOR SIMULTANEOUSLY PROVIDING TONE AND INTERMITTENT LINK ONTO A CABLE TO ASSIST IDENTIFYING THE CABLE

BACKGROUND OF THE INVENTION

This invention relates to network test instruments, and more particularly to devices to help locate a cable in an efficient manner.

In the installation and maintenance of networks or other telecommunication installations, it is often desirable or necessary to locate a particular cable associated with a particular network device. However, as the number of cables in a particular situation can be large, it becomes difficult to identify an individual cable of interest.

Applying a tone to a cable has been used in the telecommunications industry as a locating aid. A detector is used at locations remote from the application of the tone, to aid in locating the desired cable or wire pair of a cable. However, the tone does not work as well if the testing situation involves use of a hub.

Another method of locating a cable in a network installation involves providing link pulses on a network cable. The particular cable at the other end which is attached to a network device is then determinable by looking for and observing the flashing link LED on the device. But, if a hub is not present as a part of the network configuration, then this method does not work.

Heretofore, test instruments either provided tone or provided link pulses. This would require the technician troubleshooting the cables to select the proper type of test, tone or link pulse. If the technician desired to perform both types of tests, it would require first running one type of test, swapping in a different test instrument and then running the other type of test. Or, if one type of test was not working, the technician may wish to try the other type of test. Since it is likely that the end of the cable with the tone generating device or link pulse generating device is far away from the end of the cable where the tone is being detected or the link pulse is being observed, the operation of changing the type of test that is being performed can consume a lot of the technician's time with multiple trips between ends of the cable, or requires that a person be stationed at each end of the cable.

Further, in the case of the link pulse testing, the technician may not know whether the port to which the link pulse generator is being attached conforms to the IEEE 802.3 MDI specification or the IEEE 802.3 MDI-X specification (the implementation of which can be performed by a switch on the network equipment or by the use of straight or crossover cables). Heretofore, test instruments required that the technician be aware of the cabling state, and connect the instrument accordingly. Thus, a technician might assume the wrong cable state, which would cause the link pulses to not be applied to the proper cable lines, resulting in no link pulses being observable at the network device connected to the other end of the cable.

SUMMARY OF THE INVENTION

In accordance with the invention, a method and device are provided that provide both a locator tone and an intermittent link on a cable to assist in identifying that cable at another end thereof. The link pulses are alternated between transmit and receive pairs.

Accordingly, it is an object of the present invention to provide an improved cable location assistance device and method.

It is a further object of the present invention to provide an improved test instrument that provides both a tone and pulsating link on a cable under test.

It is yet another object of the present invention to provide an improved apparatus and method that will cause a link indicator on an apparatus connected to a cable to intermittently flash as well as providing a detectable tone on the cable.

Another object of the present invention is to provide an improved network test instrument that alternates link pulse between wire pairs so as to provide link pulses whether or not the IEEE 802.3 MDI specification or the IEEE 802.3 MDI-X specification is employed.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

DETAILED DESCRIPTION

The system according to a preferred embodiment of the present invention comprises a network test instrument that simultaneously applies tone and link pulses to a cable under test. The link pulses are alternated between the transmit and receive lines of the cable, to ensure link pulses no matter whether the IEEE 802.3 MDI specification or the IEEE 802.3 MDI-X specification is employed.

Figure 1:
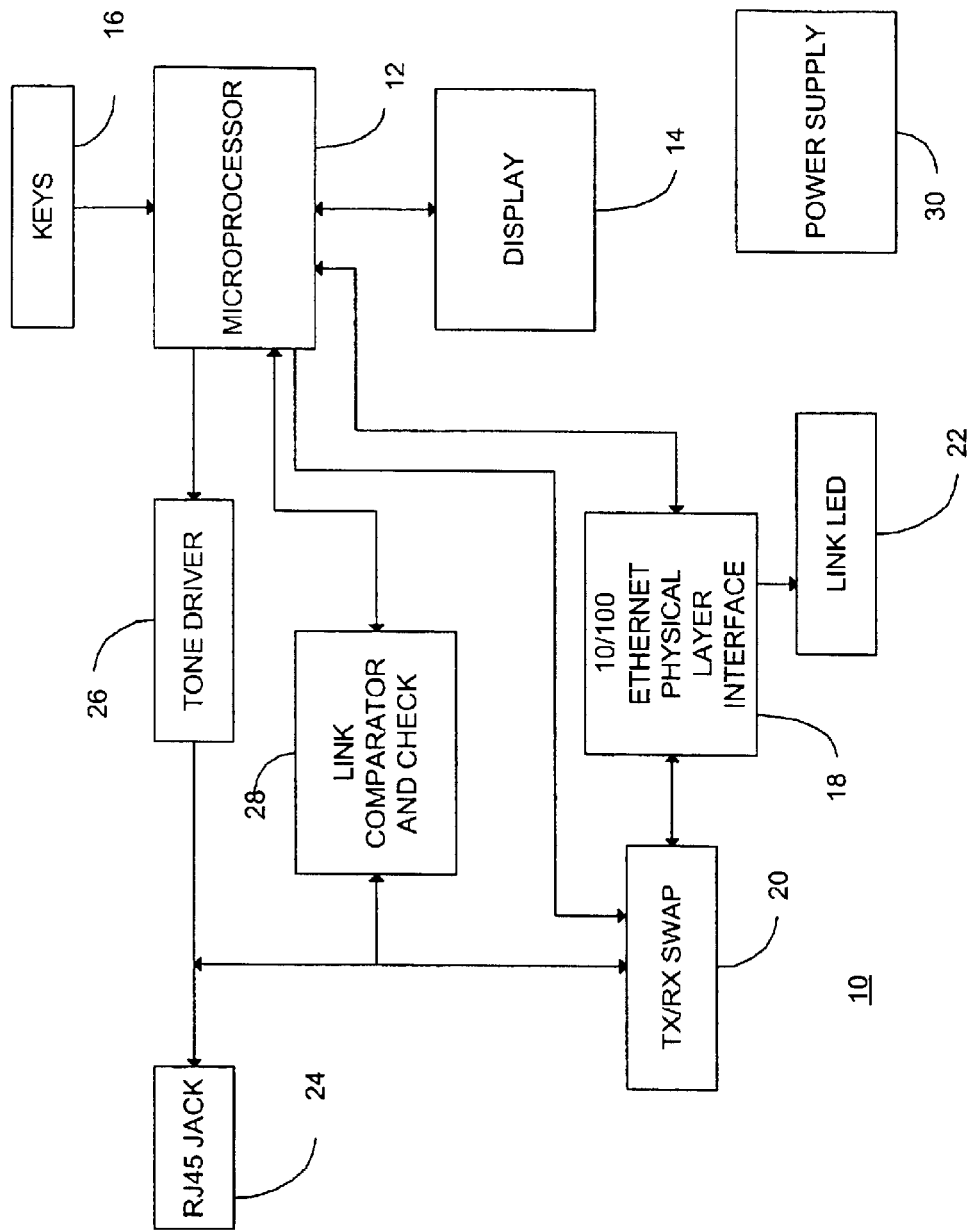
FIG. 1 is a block diagram of a test instrument in accordance with the invention.

Referring to FIG. 1, a block diagram of a network test instrument 10 in accordance with the invention, a microprocessor 12 is provided, as well as a display 14 and keys 16 connected thereto. An Ethernet physical layer interface 18 communicates with the microprocessor, and the physical layer interface drives a link indicator LED 22. The physical layer interface also is coupled with transmit/receive swap block (TX/RX SWAP) 20, which connects to an RJ45 interface jack 24. The jack 24 is further connected to a tone driver 26, the tone driver being controlled by the microprocessor 12. Still further, a link comparator and check block 28 connects with the jack 24 and with the processor 12. A power supply 30 provides the operational power, suitably generated from a battery source.

Of course, those skilled in the art will understand that other components not directly relevant to the invention are provided in the test instrument, such as input protection against over voltage, impedance matching circuits, and the like.

In operation, the operator of the device connects it to a network cable, suitably by inserting an RJ45 connector on the end of the cable under test into the corresponding RJ45 jack 24 in the test instrument. The test instrument applies a tone to the cable via the tone driver 26, and at the same time, generates link pulses via the physical layer interface 18.

Link LED 22 is lighted to indicate the presence of link. Since the time required for link to occur will vary between hubs, the present test instrument employs link comparator and check block 28 to detect when link is present back on the cable under test. This detected event is supplied to the microprocessor, which controls the rate at which the link pulses are made by the physical layer interface. Thus, the device is able to adapt to and accommodate a variety of hubs behaviors with different times required for link by timing the switching. Thus, the microprocessor waits until it detects that link has occurred, and then, after a desired amount of time has passed, will switch the transmit and receive pairs as discussed hereinbelow, looping to alternate the link pulses back and forth between the transmit and receive pairs.

Because in the particular test configuration, the IEEE 802.3 MDI specification or the IEEE 802.3 MDI-X specification might be employed, to remove the need for an operator to have to determine this point, the TX/RX SWAP block 24 is provided, and operates to alternate the link connection from the physical interface block between the transmit and receive lines on the cable, so that no matter whether a crossover connection is present or not, the link will be intermittently made. The operation of the TX/RX SWAP block 24 is governed by the microprocessor. In a particular embodiment with an Ethernet operation environment and RJ45 connections, the link pulses are alternated between the transmit cable pairs 1,2 and receive cable pairs 3,6, with the TX/RX SWAP block implemented as a transistor array.

At the same time that the link pulse operations described above are being performed, a tone is applied to the cable, using a CMOS octal driver which applies the tone, for example, in the particular embodiment of an Ethernet environment employing RJ45 connectors, which have 8 conductor wires. The tone is applied to the cable in a common mode configuration so as to not interfere with the link signal. Wires 1, 2, 4 and 5 are driven out of phase with wires 3, 6, 7 and 8. The particular frequency of the tone is selectable by operation of the microprocessor. Accordingly, a particular tone may be selected for use by a particular operator of the instrument. This tone may be selected to be unique so that if another person is performing tests at the same time, the operator of this particular instrument is not likely to mistake the tone from the other person's testing as being this operator's generated tone. The tone may warble or vary between multiple frequencies, so as to be noticeable and unique.

Figure 3:
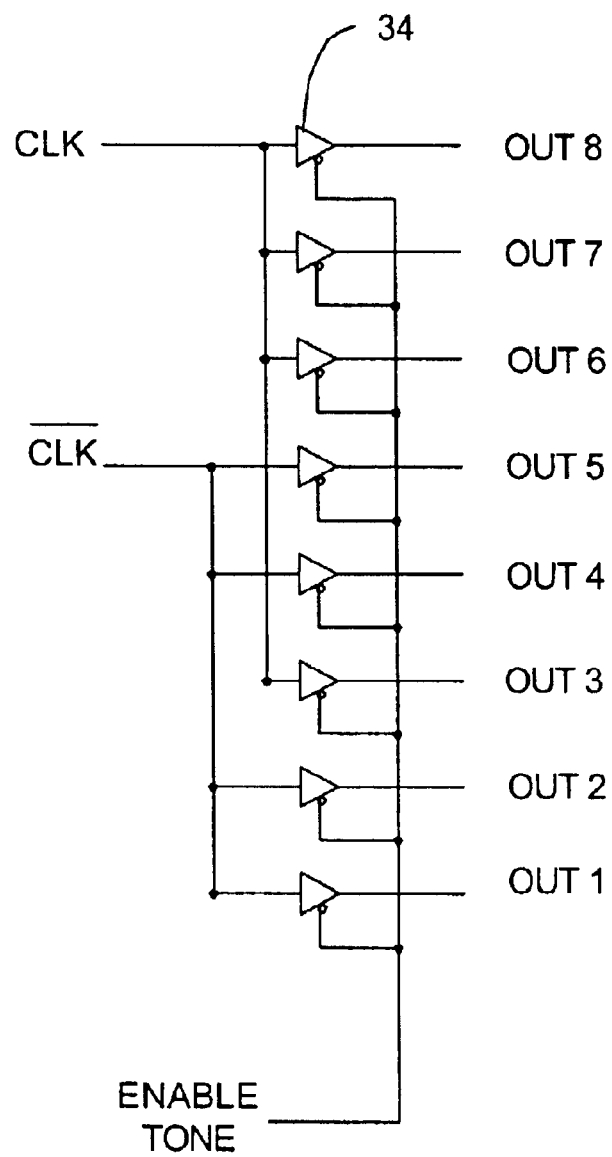
FIG. 3 is a diagram of the tone driver circuit.

FIG. 3 is a schematic diagram of the octal driver which applies the tone to the cable. The circuit comprises 8 tri-state divers 34, each of which is selected by the ENABLE TONE signal, supplied by the microprocessor. The outputs of the drivers are each connected to one of the 8 pins of the RJ45 connector. The drivers supplying pins 3, 6, 7 and 8 are driven by the clock signal CLK, supplied by the microprocessor, while the drivers that supply pins 1, 2, 4 and 5 are driven by an inverted clock signal CLK bar. Thus, wires 1, 2, 4 and 5 are driven out of phase with wires 3, 6, 7 and 8.

In operation, when tone is not applied by the test instrument, the ENABLE TONE signal is set so as to put the drivers in a high impedance state, thereby disabling the tone. Alternatively, when tone is to be applied, the ENABLE TONE signal is set to activate the drivers, and the clock signals CLK and CLK bar result in the application of a tone, based on the frequency of CLK, to the cable under test. Thus, by varying the frequency of the CLK signal, the microprocessor can select a tone of desired frequency at any given time.

Figure 2:
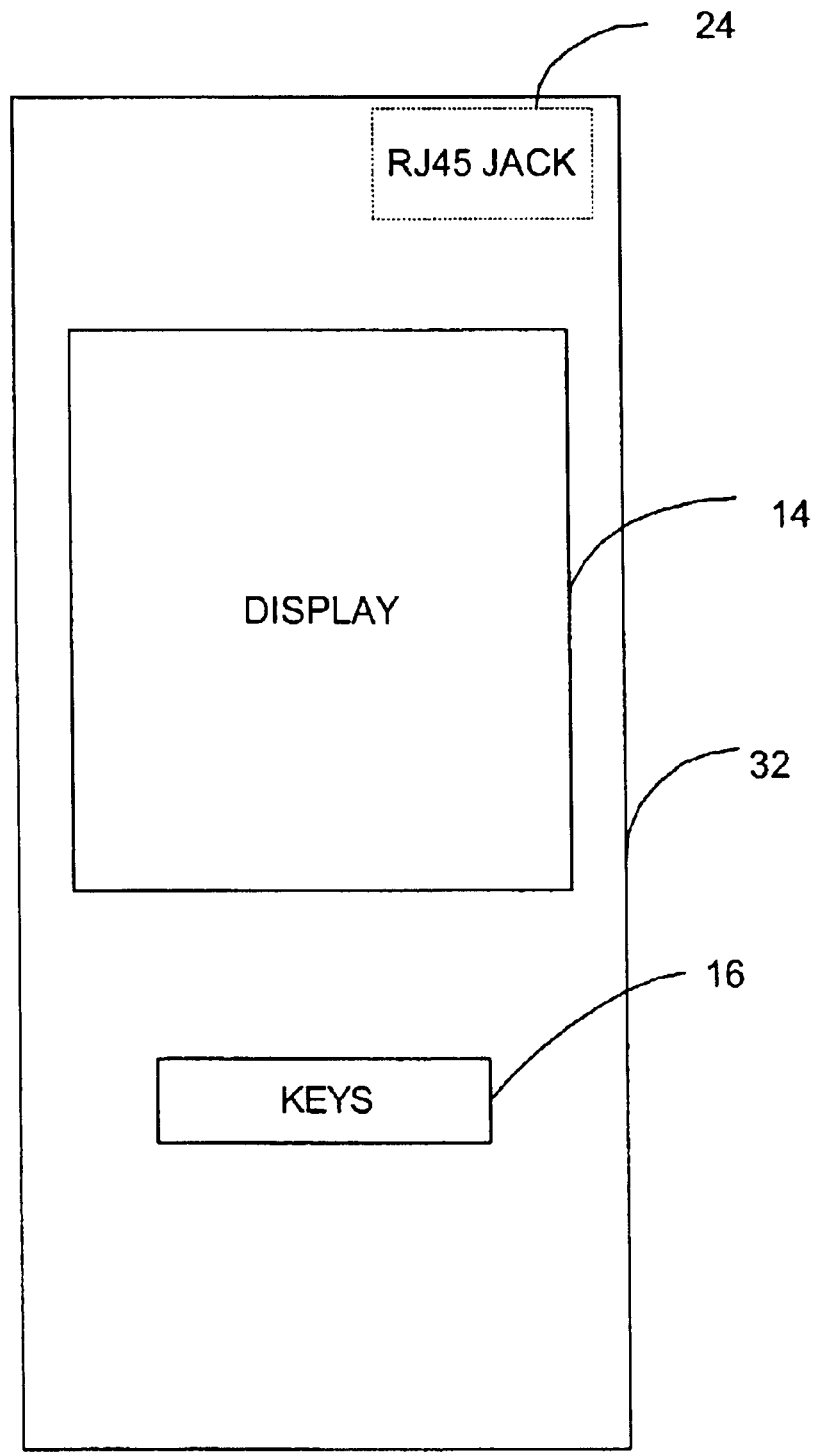
FIG. 2 is a schematic representation of a hand held test instrument as described herein.

The test instrument according to the invention is suitably implemented as a hand held device, which is illustrated schematically in FIG. 2. The device is provided in a compact case 32, which has display 14, keys 16 and RJ45 jack 24 visible from the outside thereof. The other components are contained within the case.

Thus, in accordance with the test instrument described herein, simultaneous tone and link pulse are provided to a cable under test to help efficiently locate the cable. The frequency of the tone may be varied if desired. The link pulses are alternated between the transmit and receive pairs, so that the pulses appear on the appropriate pairs irrespective of whether the IEEE 802.3 MDI specification or the IEEE 802.3 MDI-X specification is being employed.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

What is claimed is:

1. A test instrument for testing a cable under test, comprising:
   a tone driver for providing an intermittent tone to the cable under test;
   a link pulse generator for providing link pulses to the cable under test;
   wherein said tone driver and said link pulse generator simultaneously provide tone and link pulses to the cable under test.

2. A test instrument according to claim 1, wherein said cable under test has at least a first and second wires, further comprising a swapper for swapping the link pulse between said first and second wires of the cable under test.

3. A test instrument according to claim 1, wherein said cable comprises transmit and receive pairs, wherein said test instrument further comprises a transmit and receive swapper, for swapping said link pulse from said link pulse generator between said transmit and receive pairs.

4. A test instrument according to claim 3, wherein said transmit and receive swapping is repeatedly performed.

5. A test instrument according to claim 1, wherein said tone driver is adapted to provide a tone of selectable frequency.

6. A test instrument according to claim 1, wherein said tone driver is adapted to provide a tone of varying frequency.

7. A test instrument according to claim 6, wherein said tone is a warbling tone.

8. A test instrument according to claim 1, further comprising:
   a link detector for detecting when link is present; and
   a link pulse timer, for timing the generation of link pulses based on the detection of link by said link detector.

9. A device for testing Ethernet network cables, comprising:
   a microprocessor;
   a tone driver for providing an intermittent tone to the cable under test;
   a link pulse generator for providing link pulses to the cable under test;
   wherein said tone driver and said link pulses generator simultaneously provide tone and link pulses to the cable under test under direction of said microprocessor.

10. A device for testing Ethernet network cables according to claim 9, wherein said cable comprises transmit and receive pairs, wherein said test instrument further comprises a transmit and receive swapper, for swapping said link pulse from said link pulse generator between said transmit and receive pairs.

11. A device for testing Ethernet network cables according to claim 10, wherein said swapper performs the swapping operation under timing control from said microprocessor.

12. A device for testing Ethernet network cables according to claim 11, wherein said transmit and receive swapping is repeatedly performed.

13. A device for testing Ethernet network cables according to claim 9, wherein said tone driver is adapted to provide a tone of selectable frequency.

14. A device for testing Ethernet network cables according to claim 9, wherein said tone driver is adapted to provide a tone of varying frequency.

15. A device for testing Ethernet network cables according to claim 14, wherein said tone is a warbling tone.

16. A device for testing Ethernet network cables according to claim 9, further comprising:

a link detector for detecting when link is present; and wherein said microprocessor provides a link pulse timer, for timing the generation of link pulses based on the detection of link by said link detector.

17. A method for testing a network cable, comprising:

applying a tone to the network cable; and applying link pulses to the network cable, wherein said step of applying a tone to the network cable and said step of applying link pulses to the network cable are performed substantially simultaneously.

18. The method according to claim 17, further comprising swapping the link pulse between transmit and receive wires of the cable under test.

19. The method according to claim 17, wherein said step of applying a tone comprises applying the tone in a common mode.

20. The method according to claim 17, further comprising the step of varying the tone frequency in accordance with a timing.

* * * * *